United States Patent [19]

Yalamanchili et al.

[11] Patent Number: 4,459,683
[45] Date of Patent: Jul. 10, 1984

[54] READ RESETTABLE MEMORY CIRCUIT

[75] Inventors: Singh B. Yalamanchili, Cupertino; Syed T. Mahmud, Los Gatos, both of Calif.

[73] Assignee: Signetics Corporation, Sunnyvale, Calif.

[21] Appl. No.: 368,182

[22] Filed: Apr. 14, 1982

[51] Int. Cl.³ ............................................. G11C 11/00
[52] U.S. Cl. ..................................... 365/154; 307/269
[58] Field of Search ..................... 365/154; 307/247 R, 307/243, 269, 279

[56] References Cited

U.S. PATENT DOCUMENTS 4,224,533  9/1980  Lai .................................. 307/247 R
4,379,241  4/1983  Pumo .............................. 307/269 X Primary Examiner—Joseph A. Popek
Attorney, Agent, or Firm—R. J. Meetin; R. T. Mayer; T. A. Briody

[57] ABSTRACT

A read resettable memory circuit contains a flip-flop circuit (10) consisting of a flip-flop (FF) and an edge-triggered control circuit (CC) and a fall-through latch (16). The control circuit sets the flip-flop in response to a selected edge transition in a first clock ($\emptyset_1$) when an appropriate external logical set signal (S) is received and resets the flip-flop in response to a selected edge transition in a second clock ($\emptyset_2$) when an appropriate feedback logical reset signal (R) is received. The latch provides the reset signal at a value corresponding to the current logic state of the flip-flop during each period running from the selected edge transition of the second clock to its opposite edge transition and at a value corresponding to the logic state of the flip-flop that exists just before each opposite edge transition of the second clock during each remaining following period.

8 Claims, 7 Drawing Figures

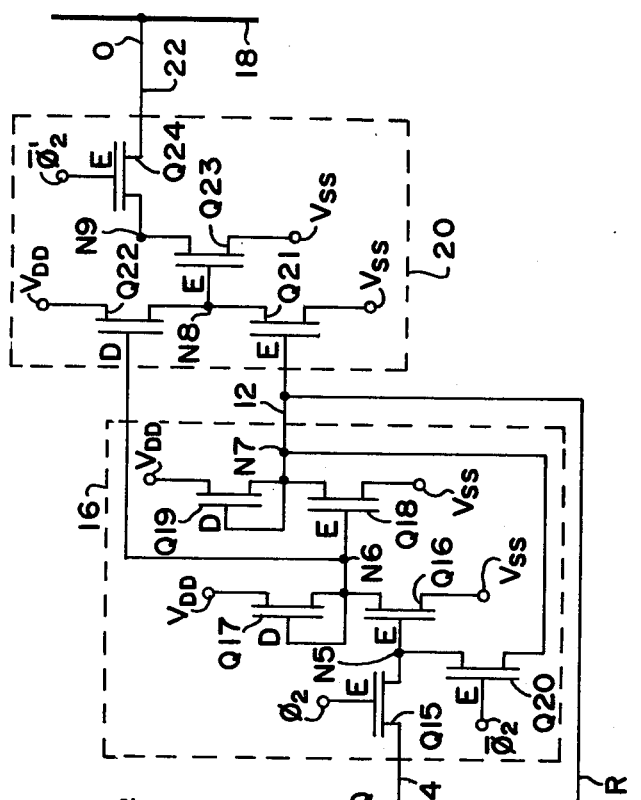
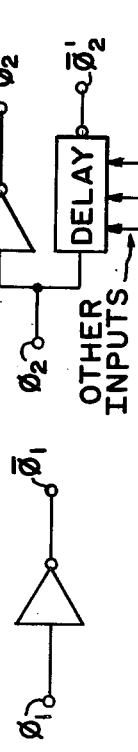
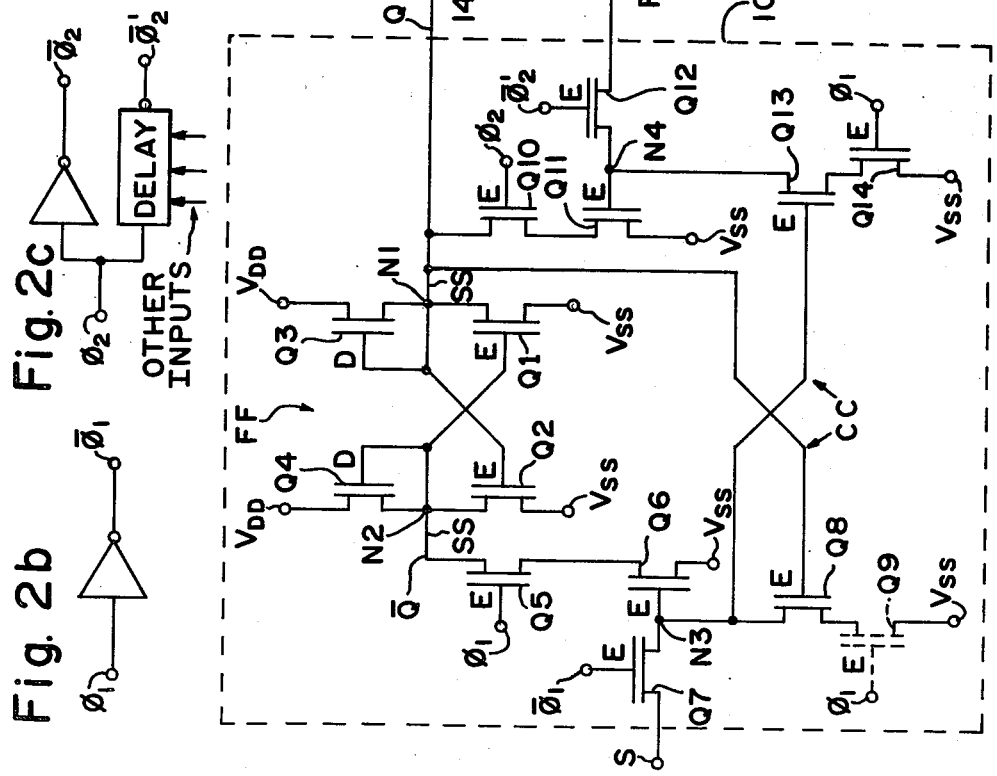
Fig. 2b
Fig. 2c
Fig. 2a

READ RESETTABLE MEMORY CIRCUIT

FIELD OF USE

This invention relates generally to semiconductor memories and more particularly to a memory circuit containing a flip-flop that is automatically placed in a given logic state after each interrogation of the flip-flop.

BACKGROUND ART

In U.S. Pat. No. 4,224,533, E. Lai discloses an edge-triggered metal-oxide semiconductor (MOS) field-effect transistor (FET) memory circuit containing a flip-flop whose logic state is controlled by a plurality of identical trigger circuits, each responsive to a different clocking signal. When an appropriate set input signal is supplied to any particular one of the trigger circuits and its clocking signal makes a low-to-high transition, the particular trigger circuit "sets" the flip-flop to a first logic state which is typically a logical "1" (hereafter simply a "1"). The term "set" as applied to the flip-flop means that it is forced into the first logic state if it is not initially there and is left there if it is already there. Likewise, when an appropriate reset input signal is supplied to the particular trigger circuit and its clocking signal makes a low-to-high transition, the trigger circuit "resets" the flip-flop to an opposite second logic state which is typically a logical "0" (hereafter simply a "0"). The term "reset" as applied to the flip-flop means that it is forced into the second logic state if it is not initially there and is left there if it is already there.

The true and complementary logical output signals of the flip-flop in this prior art device are fed back to a trigger inhibiting circuit connected to the particular trigger circuit. After it sets or resets the flip-flop, these signals enable the inhibiting circuit to inhibit it from further setting or resetting, respectively, the flip-flop while its clocking signal is still high. Because the set and reset signals do not affect the flip-flop when the clocking signal of the particular trigger circuit is low, it is effectively inhibited from further setting or resetting the flip-flop until its clocking signal makes another low-to-high transition. This allows the memory circuit to be controlled by another one of the trigger circuits during the intervening time period. This operational technique is particularly suitable in more advanced applications.

DISCLOSURE OF THE INVENTION

A memory circuit containing a flip-flop is controlled by a pair of clocking signals designated as the first clocking signal and the second clocking signal. Each clocking signal repetitively makes a pair of transitions, one of which goes from a low level up to a high level and the other of which goes from the high level down to the low level. The low level for the first clocking signal is typically the same as the low level for the second clocking signal but may be different; the same holds for the high levels.

In response to the occurrence of a selected one of the pair of transitions of the first clocking signal, an edge-triggered control circuit sets the flip-flop at a first logic state such as a "1" when an external logical set signal supplied to the control circuit is at a first logical value corresponding to the first logic state. In response to the occurrence of a selected one of the pair of transitions of the second clocking signal, the control circuit resets the flip-flop to a second logic state such as a "0" opposite to the first logic state when a feedback logical reset signal supplied to the control circuit is at the first logical value. Substantially while the second clocking signal is at its particular level that occurs just after its selected transition, a latch circuit provides the reset signal at a logical value corresponding to the logic state of the flip-flop. Substantially while the second clocking signal is at the opposite level, the latch circuit provides the reset signal at a logical value corresponding to the logic state of the flip-flop that existed just before the second clocking signal made the transition opposite to its selected transition.

In this manner, the present memory circuit acts as an asynchronous read resettable device into which the writing of a "1" is controlled by the first clocking signal. An interrogation or read operation is controlled by the second clocking signal and is performed when the reset signal is latched at the logical value corresponding to the logic state of the flip-flop existing just before the opposite transition in the second clocking signal. After the read operation is complete, the control circuit automatically resets the flip-flop to a "0" irrespective of whether a "0" or "1" was read out of the flip-flop. Where a pair of read periods are separated only by a period for writing in a "1", the flip-flop is always set at "1" which is saved for the later read period provided that the earlier read period is completed before the write period. Furthermore, the "1" is saved for the later read period even though the time during which the set signal is at "1" partially or wholly overlaps with the earlier read period.

The control circuit preferably contains a set trigger, a reset trigger, and a trigger inhibiting circuit. The inhibiting circuit inhibits the set trigger selectively while the first clocking signal is at its level that occurs just after each of its selected transitions in response to which the set trigger set the flip-flop to the first logic state. Similarly, the inhibiting circuit inhibits the reset trigger selectively while the second clocking signal is at its level that occurs just after each of its selected transitions in response to which the reset trigger reset the flip-flop to the second logic state.

BRIEF DESCRIPTION OF THE DRAWINGS

FIG. 2a is a circuit diagram of an embodiment of the memory circuit of FIG. 1 while FIGS. 2b and 2c are circuit diagrams illustrating the relationship between clocking signals employed in FIG. 2a.

FIGS. 3a and 3b are timing diagrams that illustrate the operation of the memory circuit of FIG. 2a.

Like reference symbols are employed in the drawings and in the description of the preferred embodiments to represent the same or very similar item or items.

DESCRIPTION OF THE PREFERRED EMBODIMENTS

Figure 1:
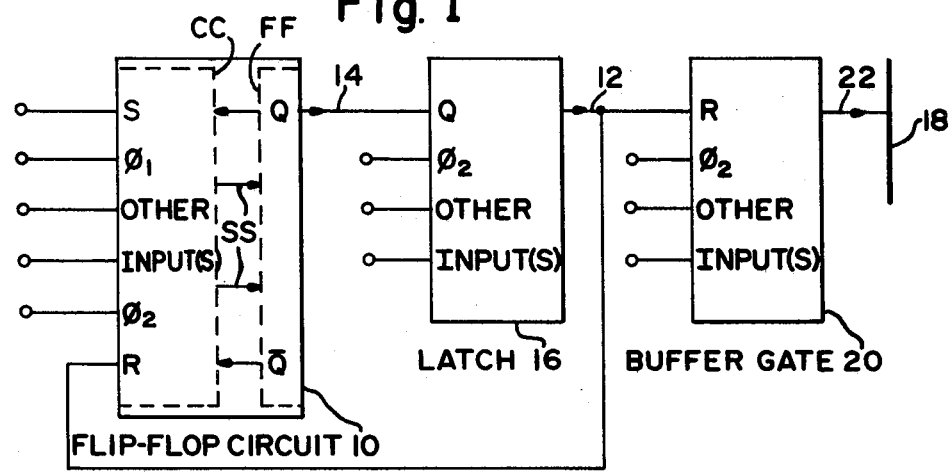
FIG. 1 is a block diagram of an embodiment of a read resettable memory circuit in accordance with the invention.

Referring to the drawings, FIG. 1 shows a block diagram for an asynchronous read resettable memory circuit controlled by a first clocking signal $\phi_1$ and a second clocking signal $\phi_2$. Clock $\phi_1$ is the set (or write "1") clock. It repetitively makes a pair of edge transitions from a low voltage level up to a high voltage level and then back to the low voltage level. Clock $\phi_2$ is both the read clock and the reset (or clear to "0") clock. It repetitively makes a pair of edge transitions from a high voltage level down to a low voltage level and then back up to the high voltage level. For both clocks $\phi_1$ and $\phi_2$, the low voltage level is about 0 volt and is referred to the "0" level. Likewise, for both clocks $\phi_1$ and $\phi_2$, the high voltage level is about 5 volts and is referred to as the "1" level.

The memory circuit contains a flip-flop circuit 10 consisting of a flip-flop FF and an edge-triggered control circuit CC that provides one or more signals SS to flip-flop FF to control its logic state as a "0" or "1". An external logical set input signal S is supplied to a set input terminal in circuit CC, and a feedback logical input signal R is supplied to a reset input terminal in circuit CC. Clocks $\phi_1$ and $\phi_2$ are provided to circuit CC in conjunction with signals R and S. One or more other inputs may also be provided to circuit CC to vary the times at which the transitions occur in clock $\phi_1$ and/or clock $\phi_2$. In response to signal(s) SS, flip-flop FF provides on a line 14 a true logical output signal Q that directly corresponds to the logic state of flip-flop FF. It also provides signal Q and a logical output signal $\overline{Q}$ complementary to signal Q back to circuit CC.

The effect of set signal S on signal Q is controlled by clock $\phi_1$, whereas the effect of reset signal R on signal Q is controlled by clock $\phi_2$. When signal S is "1" and clock $\phi_1$ makes a low-to-high transition, circuit CC sets flip-flop FF to a "1" state (irrespective of the prior state of flip-flop FF) so as to provide signal Q as a "1". The low-to-high transition in clock $\phi_1$ is the beginning of a write period that extends while clock $\phi_1$ is high to its next high-to-low transition. If signal S is "0", circuit CC does not change the logic state of flip-flop FF in response to a low-to-high transition in clock $\phi_1$. Likewise, when clock $\phi_1$ is low, signal S has no effect on signal Q. After having set flip-flop FF, circuit CC is then inhibited (or prevented) from further setting flip-flop FF to "1" during at least part of the following time period in which clock $\phi_1$ is high and preferably during the entire following time period in which clock $\phi_1$ is high so as to effectively prevent circuit CC from resetting flip-flop FF until the next low-to-high transition in clock $\phi_1$.

When signal R is "1" and clock $\phi_2$ makes a low-to-high transition, circuit CC resets flip-flop FF to a "0" state (irrespective of the prior state of flip-flop FF) so as to provide signal Q as a "0". The low-to-high transition in clock $\phi_2$ is the beginning of a reset period that extends while clock $\phi_2$ is high to its next high-to-low transition. When signal R is "0", circuit CC does not change the logic state of flip-flop FF in response to a low-to-high transition in clock $\phi_2$. Likewise, when clock $\phi_2$ is low, signal R has no effect on signal Q. After having reset flip-flop FF, circuit CC is then inhibited from further resetting flip-flop FF to "0" during at least part of the following time period in which clock $\phi_2$ is high and preferably during any portion of the following time period in which clock $\phi_2$ is high where clock $\phi_1$ is also high after having made a low-to-high transition when input S was at "1".

Flip-flop signal Q is supplied to the input terminal of a "fall-through" latch 16 which provides reset signal R from its true output terminal. The effect of signal Q on signal R is controlled by clock $\phi_2$ supplied to latch 16. One or more other inputs may also be provided to latch 16 to vary the times at which the transitions occur in clock $\phi_2$.

Reset signal R varies as a function of flip-flop signal Q and clock $\phi_2$ as follows. Substantially when clock $\phi_2$ is at its high level, latch 16 is in its fall-through mode and provides signal R at a logical value equal to the logical value of signal Q and therefore at a value corresponding to the logical state of flip-flop FF. That is, excluding the small transmission delay through latch 16, signal R follows signal Q when clock $\phi_2$ is high. When clock $\phi_2$ is at its low level, latch 16 is in its "latched" mode and provides signal R at a logical value equal to the logical value of signal Q that existed just before clock $\phi_2$ made its most recent high-to-low transition and therefore at a value corresponding to the logic state of flip-flop FF that existed at that time.

The memory circuit basically consists of circuit 10 and latch 16 which interface with a data bus 18 through a buffer gate 20 that also receives reset signal R and provides a data output signal 0 on a line 22 connected to bus 18. The logical value of signal 0 is controlled by clock $\phi_2$ which is supplied to gate 20. One or more other inputs may also be supplied to gate 20 to vary the times at which the transitions occur in clock $\phi_2$.

Gate 20 controls access to the memory circuit for reading the logic state of flip-flop FF. When clock $\phi_2$ is at its low level, gate 20 provides data signal 0 at a logical value equal to that of reset signal R and thereby, because latch 16 is then in its latched mode, at a logical value corresponding to the logic state of flip-flop FF that existed just before clock $\phi_2$ made its most recent high-to-low transition. Accordingly, each high-to-low transition in clock $\phi_2$ substantially represents the beginning of a read period that extends while clock $\phi_2$ is low to its next low-to-high transition. The memory circuit is disconnected from bus 18 (or deselected) substantially when clock $\phi_2$ is at its high level.

The circuit of FIG. 1 operates in the following manner. Only a "1" may be written into flip-flop FF from an external source (for signal S). This is performed only during a write period as circuit CC sets flip-flop FF to "1" in response to a low-to-high transition in clock $\phi_1$ when input S is at "1". Further setting of flip-flop FF is then prevented until the next low-to-high transition in clock $\phi_1$. If a read period initiated by a high-to-low transition in clock $\phi_2$ begins after the write period is completed, signal R latches at "1", and output O provides a "1" to bus 18 during the read period after which circuit CC resets flip-flop FF to "0" in response to a low-to-high transition in clock $\phi_2$. This occurs even if the read period begins (and ends) during the write period irrespective of whether flip-flop FF contained a "0" or a "1" prior to the write period since circuit CC is prevented from further setting flip-flop FF to "1" while clock $\phi_1$ is high after circuit CC set flip-flop FF at the beginning of the write period. Should another read period follow, signal R latches at "0", and output O provides a "0" to bus 18 during this second read period. No resetting of (or attempt to reset) flip-flop FF occurs while clock $\phi_2$ is high after the second read period since signal R is "0".

If a read "0" period—i.e., a read period in which a "0" is read out of flip-flop FF—is in progress and input S is at "1" in preparation for a write period, the old "0" of flip-flop FF is read out to bus 18 during the read period after which a new "1" is written into flip-flop FF during the write period and is saved for a subsequent read period irrespective of whether the write period begins after or during the first read period. In the case where the write period begins before the end of the read "0" period, the new "1" is saved because signal R is then a "0".

If a read "1" period—i.e., a read period in which a "1" is read out of flip-flop FF—is in progress and input S is at "1" in preparation for a write period, the old "1" of flip-flop FF is read out to bus 18 during the read period at the end of which circuit CC resets flip-flop FF to "0" and the new "1" is written into flip-flop FF and saved for a subsequent read period as long as the read "1" period is completed before the write period. Should the write period begin before the end of the read "1" period, the new "1" is not saved for the next read period because signal R is a "1" which enables circuit CC to reset flip-flop FF to "0" while being prevented from further setting flip-flop FF to "1". Even this case is acceptable because the new "1" supplied to flip-flop FF is the same as the old "1" read out.

A group of the present memory circuits, each having its associated buffer gate 20, are normally arrayed along data bus 18 to form a multi-bit data register. Clock $\phi_2$ is common to all of the memory circuits in the register whereas clock $\phi_1$ is different for each memory circuit.

FIG. 2a illustrates a circuit diagram of a preferred embodiment of the memory circuit including the data bus interface circuit of FIG. 1 manufactured according to conventional N-channel silicon-gate MOS technology. Each of the FET's in FIG. 2a is an N-channel insulated-gate MOS device. "E" or "D" next to the gate electrode of each FET indicates that it is an enhancement-mode or depletion-mode device, respectively.

In the circuit of FIG. 2a, clocking signals $\phi_1$, $\phi_2$, and $\phi_{2'}$ are employed to control some of the FET's. Clock $\overline{\phi}_1$ is complementary to clock $\phi_1$. As shown in FIG. 2b, complementary clock $\overline{\phi}_1$ is generated by simply inverting clock $\phi_1$. Clock $\overline{\phi}_2$ is complementary to clock $\phi_2$. The low and high levels for clock $\overline{\phi}_2$ occur at largely the same times as those for clock $\overline{\phi}_{2'}$ except that its low-to-high and high-to-low transitions are slightly delayed from those of clock $\overline{\phi}_2$. As shown in FIG. 2c, clock $\overline{\phi}_2$ is generated by simply inverting clock $\phi_2$. Clock $\overline{\phi}_{2'}$ is generated from clock $\phi_2$ by supplying it to a conventional inverting delay circuit controlled by other external inputs which fix the delay at 25-50 nanoseconds.

Returning to FIG. 2a, flip-flop FF consists of a pair of cross-coupled switching FET's Q1 and Q2 connected by their drains through nodes N1 and N2, respectively, to the sources of FET's Q3 and Q4, respectively. FET's Q1 and Q2 are the data storage element. Their sources are connected to a supply of a substantially constant voltage $V_{SS}$ which is preferably ground reference (0 volt). FET's Q3 and Q4 are the loads with their gate electrodes tied respectively back to their sources. Their drains are connected to a supply of another substantially constant voltage $V_{DD}$ which is preferably 5 volts. Flip-flop signal Q is provided at node N1 along line 14, and complementary signal $\overline{Q}$ is provided at node N2.

Control circuit CC is the remainder of circuit 10 and consists of a set trigger, a reset trigger, and a trigger inhibiting circuit. The triggers provide control signals SS which are the same as signals Q and $\overline{Q}$ (i.e., are supplied to nodes N1 and N2). The inhibiting circuit consists of a set inhibiting circuit that selectively inhibits the set trigger and a reset inhibiting circuit that selectively inhibits the reset trigger and includes some elements in common with the set inhibiting circuit.

The set trigger consists of FET's Q5, Q6, and Q7. FET's Q5 and Q6 are serially connected between node N2 and the $V_{SS}$ supply, respectively. FET Q7 is connected between the set input terminal at which signal S is received and the gate electrode of FET Q6 by way of a node N3. FET Q5 is controlled by clock $\phi_1$, while FET Q7 is controlled by clock $\overline{\phi}_1$.

The set inhibiting circuit consists of a FET Q8 coupled between node N3 and the $V_{SS}$ supply and controlled by signal $\overline{Q}$ supplied from node N1. An optional FET Q9 (indicated in dotted lines) controlled by clock $\phi_1$ is serially connected between FET Q8 and the $V_{SS}$ supply. As indicated below, FET Q9 does not affect the operation of the inhibiting circuit but is employed to avoid a possible race condition at node N3 when node N1 charges. FET Q7 may also be considered as part of the set inhibiting circuit.

The reset trigger consists of FET's Q10, Q11, and Q12. FET's Q10 and Q11 are serially connected between node N1 and the $V_{SS}$ supply, respectively. FET Q12 is connected between the reset input terminal at which signal R is received and the gate electrode of FET Q11 by way of a node N4. FET Q10 is controlled by clock $\phi_2$, while FET Q12 is controlled by clock $\overline{\phi}_{2'}$ and therefore essentially by clock $\overline{\phi}_2$.

The reset inhibiting circuit consists of FET Q8, FET Q9 (if included), and a pair of serially-connected FET's Q13 and Q14 connected between node N4 and the $V_{SS}$ supply, respectively. FET Q13 is controlled by the voltage at node N3, and FET Q14 is controlled by clock $\phi_1$. FET Q12 may also be considered as part of the reset inhibiting circuit.

Signal Q is provided to one source/drain element of an FET Q15 in latch 16. Clock $\phi_2$ controls FET Q15 while its other source/drain element is connected through a node N5 to the input terminal of a first inverter consisting of a switching FET Q16 and a load FET Q17 connected in the conventional manner as shown. The output signal from the first inverter is supplied from a node N6 to the input terminal of a second inverter consisting of a switching FET Q18 and a load FET Q19 connected in the conventional manner shown. Signal R is the output of the second inverter supplied on line 12 from a node N7. An FET Q20 controlled by clock $\overline{\phi}_2$ is connected between nodes N5 and N7 to provide the feedback path needed to latch signal R when clock $\phi_2$ is low and clock $\overline{\phi}_2$ is high. Inasmuch as the voltage at node N5 is inverted at node N6 and then reinverted at node N7, the logical value for signal R follows the logical value of the voltage at node N5.

Signal R is supplied to the input terminal of an inverter in gate 20. This inverter consists of a switching FET Q21 and a load FET Q22 connected in the manner shown with the gate electrode of FET Q22 connected through node N6 to receive the output of the first inverter in latch 16. The output of this inverter in gate 20 is provided from a node N8 to the gate electrode of an FET Q23 connected between a node N9 and the $V_{SS}$ supply. An FET Q24 controlled by clock $\overline{\phi}_{2'}$ is connected between node N9 and line 22 to provide signal 0 to data bus 18. FET's Q23 and Q24 act as another inverter. Inasmuch as signal R is inverted at node N8 and then reinverted at node N9, the logical value for the voltage at node N9 follows the logical value for signal R. FET's Q21, Q22, and Q23 basically serve to adjust the voltage/current at node N9 to a suitable level for bus 18. When FET Q24 is on, it transmits the logical value of signal R to bus 18.

Insofar as the essential operation of the circuit of FIG. 2a is concerned, FET's Q12 and Q24 are effectively controlled by clock $\overline{\phi}_2$. Clock $\overline{\phi}_{2'}$ serves to allow the voltage at node N7 to settle before a data bit is gated to node N4 and bus 18. The transmission delay of latch 16 is 5–10 nanoseconds less than the delay of clock $\overline{\phi}_{2'}$. In fact, FET's Q12 and Q24 could be directly controlled by clock $\overline{\phi}_2$, and clock $\overline{\phi}_{2'}$ could be deleted.

Figure 3A:
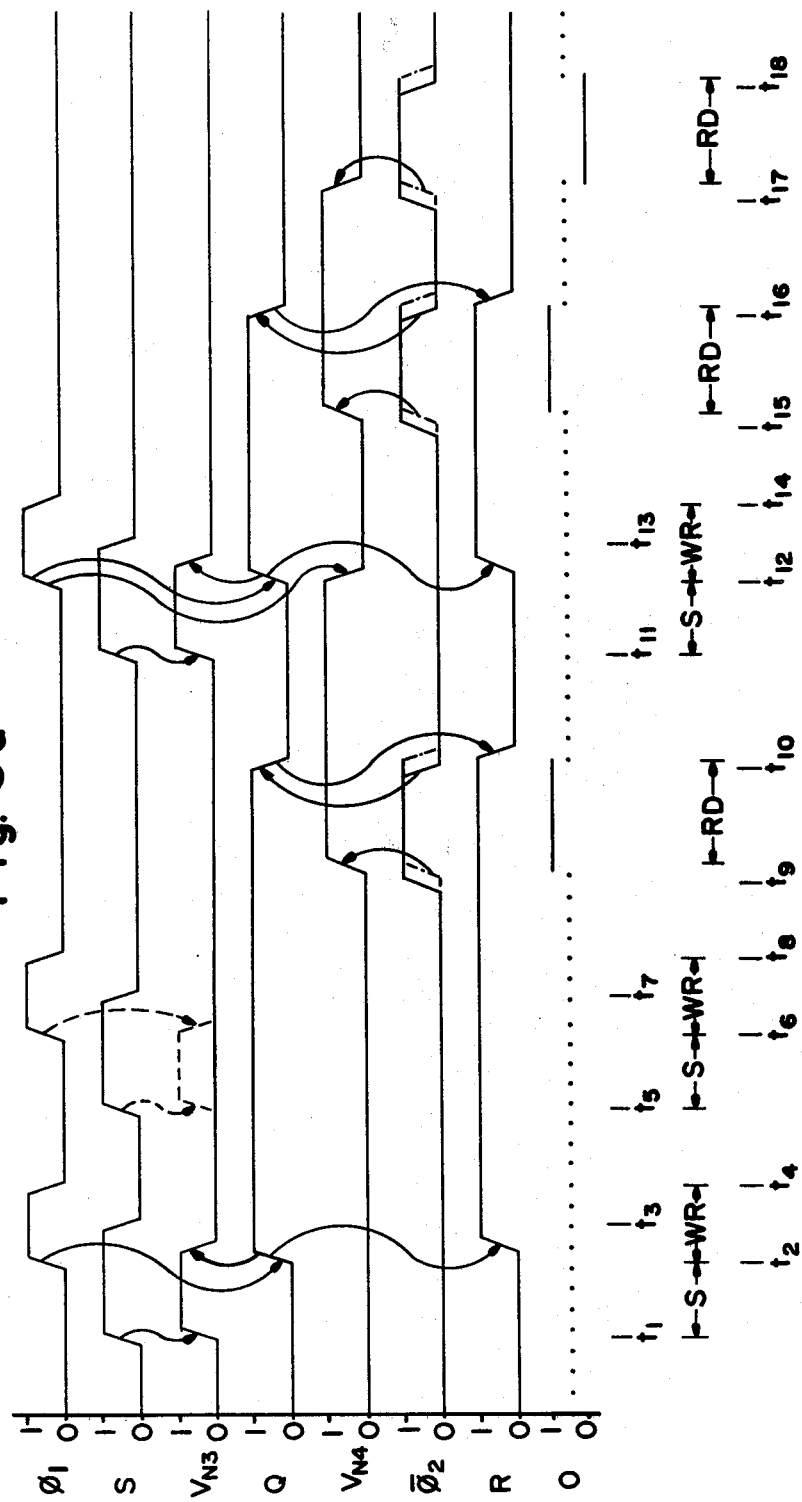
Figure 3B:
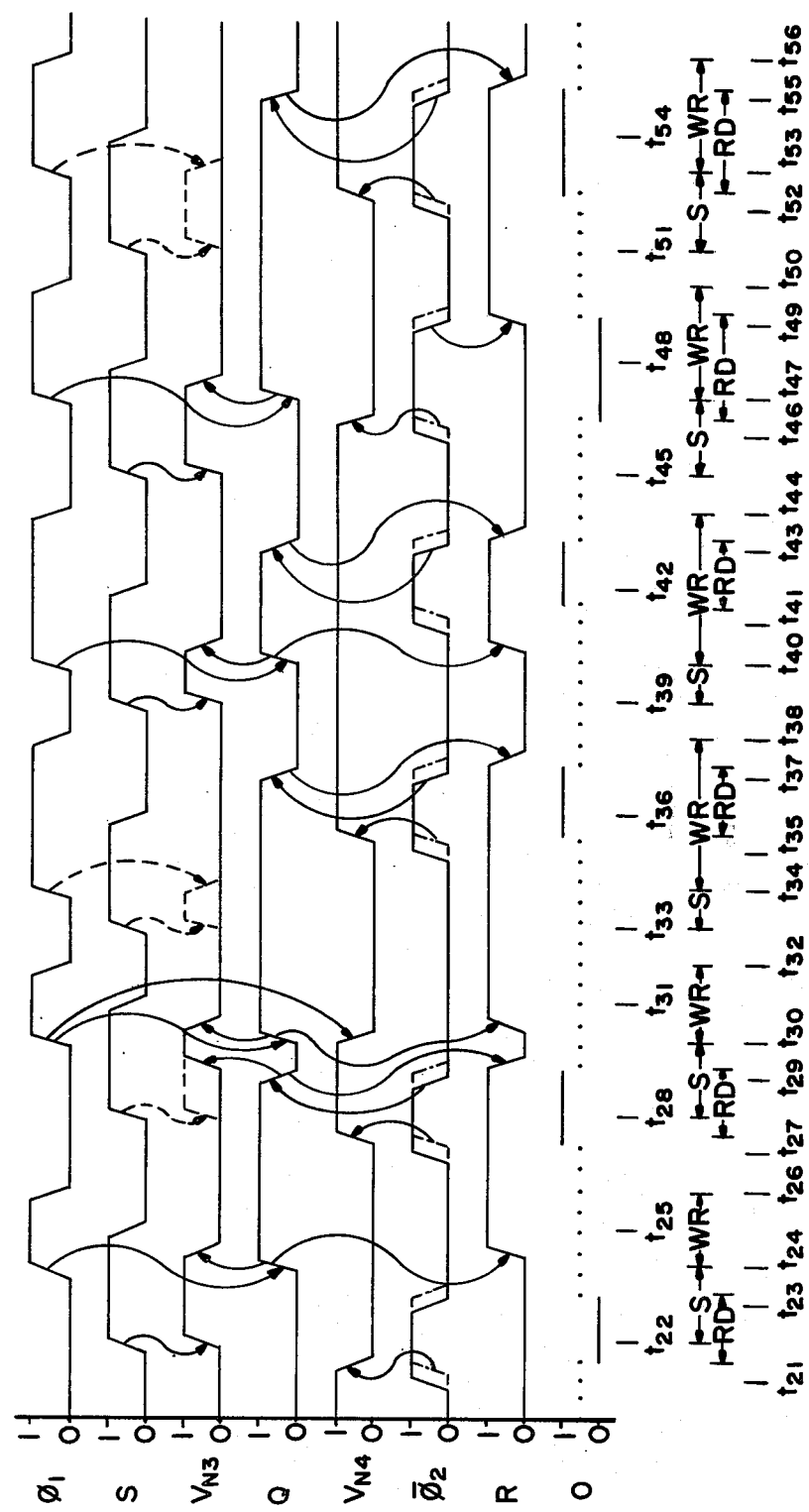

Turning to FIGS. 3a and 3b, they show timing diagrams useful in understanding the operation of the circuit of FIG. 2a. All the parameters in FIGS. 3a and 3b are illustrated as varying between a "0" and "1" level as a function of time t. In each of FIGS. 3a and 3b, increasing numerical subscripts for (time) t represent progressively later times. $V_{N3}$ and $V_{N4}$ are the voltages at nodes N3 and N4, respectively. The dot-and-dash lines indicate clock $\overline{\phi}_{2'}$ to the extent that it differs from $\overline{\phi}_2$. Each of the (curved) arrows indicates a transition in one parameter that causes a transition in another of the parameters. The dashed lines indicate the slight differences that occur when circuit CC contains optional FET Q9. The time intervals labeled "WR" represent the write periods. The time intervals labeled "S" represent the time intervals at which signal S is at "1" to the extent that these intervals begin before the WR intervals. The time intervals labeled "RD" are the read periods defined by the transitions in clock $\overline{\phi}_{2'}$.

During operation, FET's Q3, Q4, Q17, Q19, and Q22 are always on whereas the other FET's switch. Inasmuch as signal R follows the voltage at node N5, the switching operation of FET's Q16 and Q18 in latch 16 will be described by referring only to the condition of signal R. When signal R is at "0", node N8 is at a "1" which turns on FET Q23 in gate 20 to bring node N9 down to "0". On the other hand, when signal R is at "1", node N8 is at "0" which turns off FET Q23 and allows node N9 to "float" which is equivalent to a "1". Since node N9 follows signal R, the switching operation of FET's Q21 and Q12 will be described by referring only to the condition of signal R.

In the "0" state of flip-flop FF, FET Q1 is on and FET Q2 is off. The converse is true in the "1" state. In describing the operation of the memory circuit, the on/off condition of FET's Q1 and Q2 will be described by referring only to the state of signal Q and/or $\overline{Q}$.

FIG. 3a shows six examples of situations in which the read periods do not overlap at all with the combined set and write periods. Prior to $t_1$ at which the first example begins, the circuit of FIG. 2a is at the typical "zero-point" condition that normally exists just after two successive read operations without an intervening write operation. In the zero-point condition, flip-flop FF is in the "0" state. Signal Q is thereby "0" which is supplied to FET Q8 to turn it off. Nodes N3 and N4 are in their discharged state at "0", causing FET's Q6 and Q11, respectively, to be turned off. Clock $\phi_1$ is low causing FET's Q5, Q9 (if included), and Q14 to be turned off, while clock $\overline{\phi}_1$ is high causing FET Q7 to be turned on. Clock $\overline{\phi}_2$ and consequently clock $\overline{\phi}_{2'}$ are low so that FET's Q12, Q20, and Q24 are turned off, while clock $\phi_2$ is high so that FET's Q10 and Q15 are turned on. Accordingly, latch 16 is in its fall-through mode in which signal R follows the current value of signal Q at "0". The memory circuit is disconnected from data bus 18 as indicated by the indeterminate condition of output O. Set input S is at "0".

The first example illustrates the basic write operation starting from the zero-point condition. At $t_1$, input S rises to "1". Since FET Q7 is on, node N3 charges to "1" which, in turn, turns on FET's Q6 and Q13. Because FET Q5 is still off, nothing happens to flip-flop FF at this point. A write period begins at $t_2$ as clock $\phi_1$ makes a low-to-high transition to turn on FET's Q5, Q9 (if included), and Q14, while clock $\overline{\phi}_1$ makes an opposite high-to-low transition to turn off FET Q7 and temporarily trap (the charge forming) the "1" at node N3. Since FET Q6 is on and FET Q11 is off so that it does not tie node N1 to the $V_{SS}$ supply, node N2 is pulled down to the "0" of the $V_{SS}$ supply, causing flip-flop FF to change state and provide signal Q as a "1". The feedback of this "1" to FET Q8 then turns it on to provide a path through FET's Q8 and Q9 (if included) to discharge node N3 to the "0" of the $V_{SS}$ supply so as to inhibit the set trigger from further setting flip-flop FF while clock $\phi_1$ is high. Signal R follows signal Q to "1". However, node N4 stays at "0" since FET Q12 is off. At $t_3$, signal S returns to "0". The write period ends at $t_4$ as clock $\phi_1$ makes a high-to-low transition to turn off FET's Q5, Q9 (if included), and Q14, while clock $\overline{\phi}_1$ makes an opposite low-to-high transition to turn on FET Q7.

The second example which begins at $t_5$ illustrates the basic differences in operation that occur when optional FET Q9 is utilized in the memory circuit. The second example also shows how circuit CC prevents a write operation from affecting flip-flop FF when it is already at "1". At $t_5$, signal S rises to "1". When included, FET Q9 is off which enables node N3 to rise to "1" causing FET Q6 to turn on. In the absence of FET Q9, node N3 is continuously discharged through FET Q8 to "038". A write period begins at $t_6$ as clock $\phi_1$ goes high to turn on FET's Q5 and Q14 and clock $\overline{\phi}_1$ goes low to turn off FET Q7. When FET Q9 is included, it also turns on to reestablish the path to the $V_{SS}$ supply for node N3 and enable it to discharge to "0". This turns FET Q6 back off to prevent the set trigger from attempting to enter a "1" into flip-flop FF since it already contains a "1". In the absence of FET Q9, node N3 remains discharged so as to keep FET Q6 turned off which likewise prevents the set trigger from affecting flip-flop FF. Whether FET Q6 remains off or is turned off just after $t_6$, the effect is that the new "1" is written in over the old "1". In short, the presence or absence of FET Q9 does not affect the consequential operation of the inhibiting circuit. At $t_7$, input S returns to "0". The write period ends at $t_8$ as clock $\phi_1$ goes low to turn off FET's Q5, Q9 (if included), and Q14, and clock $\overline{\phi}_1$ goes high to turn on FET Q7.

No reference to FET Q9 is made in the remaining examples inasmuch as it does not affect the overall memory circuit operation. Nevertheless, the voltage changes at node N3 resulting from the use of FET Q9 are displayed in the sections of timing diagrams for the remaining examples.

The third example which begins at $t_9$ illustrates the basic read "1" operation. At $t_9$, clock $\overline{\phi}_2$ makes a low-to-high transition to turn on FET Q20 while clock $\phi_2$ makes an opposite high-to-low transition to turn off FET's Q10 and Q15. These transitions cause latch 16 to latch signal R at a "1". A read period begins shortly thereafter as clock $\overline{\phi}_{2'}$ makes a corresponding low-to-high transition to turn on FET's Q12 and Q24. Gate 20 then provides output O at a "1". Since FET's Q13 and Q14 are off, node N4 charges to "1" which turns on FET Q11. At $t_{10}$, clock $\overline{\phi}_2$ makes a high-to-low transition to turn off FET Q20, while clock $\phi_2$ makes a low-to-high transition to turn on FET's Q10 and Q15. Since FET Q11 is on and node N2 is not tied to the $V_{SS}$ through FET Q6 because it is off, node N1 is pulled down through FET's Q10 and Q11 to the $V_{SS}$ supply to reset flip-flop FF and bring signal Q down to "0". The transitions in clocks $\overline{\emptyset}_2$ and $\emptyset_2$ also return latch 16 to its fall-through mode, forcing signal R to follow signal Q down to "0". Shortly thereafter, clock $\emptyset_{2'}$ makes a corresponding high-to-low transition to turn off FET's Q12 and Q24 so as to end the read period and return output O to its indeterminate status.

The fourth example which starts at $t_{11}$ illustrates how node N4 is discharged to inhibit the reset trigger and enable flip-flop FF to be set during a write operation. At $t_{11}$, signal S rises to "1" causing node N3 to charge which turns on FET's Q6 and Q13. A write operation begins at $t_{12}$ as clock $\emptyset_1$ goes high to turn on FET's Q5 and Q14 and clock $\overline{\emptyset}_1$ goes low to turn off FET Q7. This enables the reset inhibiting circuit to inhibit the reset trigger as node N4 discharges through FET's Q13 and Q14 to "0" to turn off FET Q11. With FET Q11 off and FET Q6 on, node N2 is pulled down to "0" through FET's Q5 and Q6 to set flip-flop FF and bring signal Q up to "1". In turn, FET Q8 now turns on to discharge node N3 and inhibit the set trigger. Signal R follows signal Q to "1". At $t_{13}$, input S returns to "0". The write period ends at $t_{14}$ as clock $\emptyset_1$ goes low to turn off FET's Q5 and Q14 while clock $\overline{\emptyset}_1$ goes high to turn on FET Q7.

The fifth example is a read "1" operation that repeats the read "1" operation of the third example so as to return reset signal Q to "0" in order to establish the initial conditions needed for the read "0" operation of the sixth example. In the fifth example, the same events occur at $t_{15}$ and $t_{16}$ as described above for $t_9$ and $t_{10}$, respectively.

The sixth example begins at $t_{17}$ as clock $\overline{\emptyset}_2$ goes high to latch signal R at "0". Shortly thereafter, clock $\emptyset_{2'}$ goes high to begin a read period and turn on FET's Q12 and Q24. Output O goes to "0". Since FET Q13 is off and signal R is "0", node N4 discharges through FET Q12 to the "0" on line 12. This turns off FET Q11 to prevent the reset trigger from attempting to enter a "0" in flip-flop FF since it already contains a "0". At $t_{18}$ clock $\overline{\emptyset}_2$ goes low to return latch 16 to its fall-through mode. The memory circuit is now back at the zero-point condition.

FIG. 3b shows six examples (referred to as the seventh through twelfth examples) of cases in which a read period overlaps with a combined set and write period. Just prior to $t_{21}$ at which the seventh example begins, the memory circuit is at the zero-point condition except that node N4 is at "1" which turns on FET Q11.

The seventh example illustrates the case in which a read "0" operation is completed before a write operation begins but while a set period is in progress. At $t_{21}$, clock $\overline{\emptyset}_2$ goes high to latch signal R at "0". When clock $\emptyset_{2'}$ goes high to begin a read period, node N4 discharges through FET Q12 to the "0" on line 12 to turn off FET Q11. Output O is "0". At $t_{22}$, input S rises to "1" to charge node N3 and turn on FET Q6. At $t_{23}$, clock $\overline{\emptyset}_2$ goes low to place latch 16 in its fall-though mode. Clock $\emptyset_{2'}$ then goes low to end the read period. At $t_{24}$, a write period begins as clock $\emptyset_1$ goes high. This sets flip-flop FF at "1" since FET Q11 is off. FET Q8 turns on to discharge node N3 which turns off FET Q6 to inhibit the set trigger. Signal R follows signal Q up to "1" but does not charge node N4 since FET Q12 is off. At $t_{25}$, signal S returns to "0". The write period ends at $t_{26}$ as clock $\emptyset_1$ goes low. In short, the old "0" is read out of flip-flop FF, and a new "1" is written in and saved for a subsequent read operation.

The eighth example which begins at $t_{27}$ represents the case in which a read "1" operation is completed before a write operation begins but while a set period is in progress. At $t_{27}$, clock $\overline{\emptyset}_2$ goes high to latch signal R at "1". When clock $\emptyset_{2'}$ goes high to begin the read period, signal R charges node N4 to "1" which turns on FET Q11. Output O goes to "1". At $t_{28}$, input S rises to "1" but node N3 is continuously discharged to "0" through FET Q8 which is on.

At $t_{29}$, clock $\overline{\emptyset}_2$ goes low to place latch 16 in its fall-through mode. Since FET Q11 is on and FET Q6 is off, the reset trigger resets flip-flop FF to "0". In turn, this causes FET Q8 to turn off which allows node N3 to charge to "1" since FET Q7 is on. FET's Q6 and Q13 turn on. Signal R follows signal Q down to "0". Clock $\emptyset_{2'}$ then goes low to end the read period and prevent node N4 from discharging to the "0" on line 12. At $t_{30}$, a write period begins as clock $\emptyset_1$ goes high. FET Q14 turns on. Since FET Q13 is on, node N4 discharges through FET's Q13 and Q14 to inhibit the reset trigger. This allows the set trigger to set flip-flop FF at "1" which, in turn, causes FET Q8 to turn on and discharge node N3 to turn off FET Q6 and inhibit the set trigger. FET Q13 also turns off. Signal R follows signal Q up to "1". At $t_{31}$, signal S drops back to "0". The write period ends at $t_{32}$ as clock $\emptyset_1$ goes low. In short, the old "1" is read out of flip-flop FF after which it is reset to "0", and a new "1" is written into flip-flop FF and saved for a subsequent read operation.

The ninth example which begins at $t_{33}$ illustrates the case in which flip-flop FF contains a "1" when a write operation begins after which a read operation begins. At $t_{33}$, input S rises to "1". Since FET Q8 is on, node N3 remains discharged. A write period begins at $t_{34}$ as clock $\emptyset_1$ goes high. Because FET Q6 is off, flip-flop FF remains at "1". At $t_{35}$, clock $\overline{\emptyset}_2$ goes high to latch signal R at "1". Output O goes to a "1" shortly thereafter as a read period begins when clock $\emptyset_{2'}$ goes high. This causes node N4 to charge and turn on FET Q11. At $t_{36}$, input S returns to "0". At $t_{37}$, clock $\overline{\emptyset}_2$ goes low. Flip-flop FF is reset to "0". Latch 16 returns to its fall-through mode enabling signal R to follow signal Q to "0". The read period ends shortly later when clock $\emptyset_{2'}$ goes low. The write period ends at $t_{38}$ as clock $\emptyset_1$ goes low. The effective result is that the new "1" is written over the old "1" and then read after which flip-flop FF is reset to "0".

The tenth example which begins at $t_{39}$ illustrates the case in which flip-flop FF contains a "1" when a write operation begins after which a read operation begins. At $t_{39}$, input S goes to "1" causing node N3 to charge and turn on FET Q6. A write period begins at $t_{40}$ as clock $\emptyset_1$ goes high. Flip-flop FF is set to a "1" which turns on FET Q8 to discharge node N3 and inhibit the set trigger. Signal R follows signal Q to "1". At $t_{41}$, clock $\overline{\emptyset}_2$ goes high to latch signal R at "1". Output "0" goes to a "1" shortly thereafter as a read period begins when clock $\emptyset_{2'}$ goes high. This causes node N4 to charge and turn on FET Q11. At $t_{42}$, input S goes back to "0". At $t_{43}$, clock $\overline{\emptyset}_2$ goes low. Flip-flop FF is reset to "0". Signal R follows signal Q to "0" as latch 16 returns to its fall-through mode. The read period ends shortly thereafter when clock $\emptyset_{2'}$ goes low. The write period ends at $t_{44}$ as clock $\emptyset_1$ goes low. In short, the new "1" is written over the old "0" and then read after which flip-flop FF is reset to "0".

The eleventh example which begins at $t_{45}$ illustrates the case in which a read "0" operation begins while a set period is in progress but before a write operation begins. At $t_{45}$, input S rises to "1" to charge node N3 and turn on FET Q6. At $t_{46}$, clock $\emptyset_2$ goes high to latch signal R at "0". A read period begins shortly thereafter when clock $\emptyset_{2'}$ goes high. Output O goes to a "0". Node N4 discharges to the "0" on line 12 to turn off FET Q11. A write period begins at $t_{47}$ as clock $\emptyset_1$ goes high. Flip-flop FF is set to a "1" which turns on FET Q8 to discharge node N3 and inhibit the set trigger as FET Q6 turns off. At $t_{48}$, signal S returns to "0". At $t_{49}$, clock $\emptyset_2$ goes low to return latch 16 to its fall-through mode and cause signal R to follow signal Q to "1". The read period ends shortly thereafter when clock $\emptyset_{2'}$ goes low to keep node N4 discharged. The write period ends at $t_{50}$ as clock $\emptyset_1$ goes low. In short, the old "0" is read out, after which a new "1" is written in and saved for a subsequent read operation.

The twelfth (and final) example which begins at $t_{51}$ illustrates the case in which a read "1" operation begins while a set period is in progress but before a write operation begins. At $t_{51}$, input S rises to "1". Because FET Q8 is on to inhibit the set trigger, node N3 remains discharged to keep FET's Q6 and Q13 off. At $t_{52}$, clock $\emptyset_2$ goes high to latch signal R at "1". A read period begins when clock $\emptyset_{2'}$ goes high. Output O goes to "1" while node N4 charges to "1" to turn on FET Q11 since FET Q13 is off. A write period begins at $t_{53}$ as clock $\emptyset_1$ goes high. This has no effect on flip-flop FF since FET Q6 is off. Input S returns to "0" at $t_{54}$. At $t_{55}$, clock $\emptyset_2$ goes low to reset flip-flop FF. Latch 16 returns to its fall-through mode as signal R follows signal Q down to "0". The write period ends at $t_{56}$ as clock $\emptyset_1$ goes low. In short, the old "1" is read after which flip-flop FF is reset to "0", the new "1" being lost. This situation is acceptable in the sense that this particular sequencing of clocks $\emptyset_1$ and $\emptyset_2$ (or $\emptyset_{2'}$) is normally avoided in the operation of the memory circuit.

Figure 4:
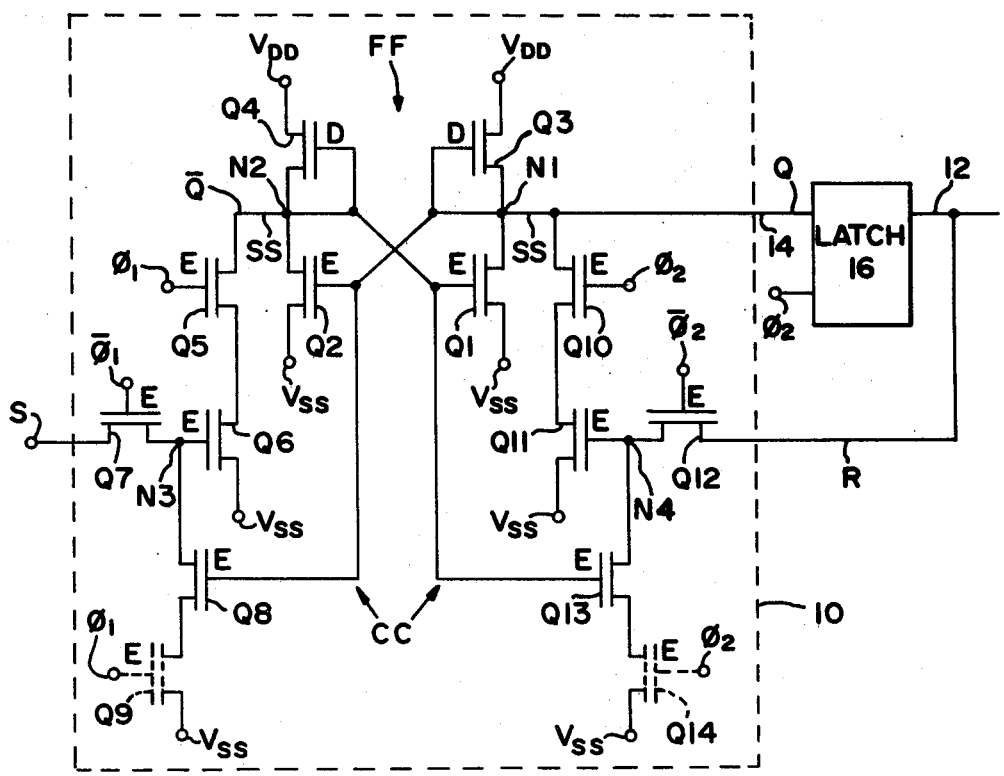
FIG. 4 is a circuit diagram of another embodiment of the memory circuit of FIG. 1.

Turning to FIG. 4, it depicts a circuit diagam of the present memory circuit in which another embodiment of circuit 10 is employed. Each of the FET's in FIG. 4 is an N-channel device. The convention adopted for FIG. 2a with respect to enhancement-mode and depletion-mode FET's is also employed in FIG. 4. Clocks $\emptyset_1$ and $\emptyset_2$ are generated from clocks $\emptyset_1$ and $\emptyset_2$, respectively, for the memory circuit of FIG. 4 in the same way as shown in FIGS. 2b and 2c for the circuit of FIG. 2a.

In FIG. 4, flip-flop FF consists of FET's Q1, Q2, Q3, and Q4 connected in the same manner as before. In control circuit CC, the set trigger consists of FET's Q5, Q6 and Q7 connected as before. The reset trigger consists of FET's Q10, Q11, and Q12 connected as before with the exception that FET Q12 is controlled by clock $\emptyset_2$ rather than clock $\emptyset_{2'}$ which could alternatively be used to control FET Q12. The inhibiting circuit consists of a set inhibiting circuit consisting of FET's Q8 and Q9 connected as before and a separate reset inhibiting circuit consisting of FET's Q13 and Q14 connected as before except that they are now controlled by different signals. Signal Q is now applied through node N2 to the gate electrode of FET Q13 to control its operation. FET Q14 is now controlled by clock $\emptyset_2$. FET's Q9 and Q14 are optional.

The memory circuit of FIG. 4 operates largely in the same manner as the memory circuit of FIG. 2a. The principal difference is that the inhibiting circuit starts to inhibit the reset trigger directly after it has the flip-flop FF to "0" instead of beginning to inhibit the reset trigger at the beginning of the next write period as occurs in the memory circuit of FIG. 2a.

While the invention has been described with reference to particular embodiments, this description is solely for the purpose of illustration and is not to be construed as limiting the scope of the invention claimed below. For example, FET's of opposite polarity type to those described above or bipolar transistors may be utilized to accomplish the same results. Thus, various modifications, changes, and applications may be made by those skilled in the art without departing from the true scope and spirit of the invention as defined by the appended claims.

What is claimed is:

1. A memory circuit which contains a flip-flop and is controlled by a first clocking signal that repetitively makes a pair of first transitions of which one goes from a first low level up to a first high level and the other goes from the first high level down to the first low level and by a second clocking signal that repetitively makes a pair of second transitions of which one goes from a second low level up to a second high level and the other goes from the second high level down to the second low level, characterized by:

edge-triggered control means responsive to the occurrence of a selected one of the pair of first transitions for setting the flip-flop to a first logic state when a logical set signal supplied thereto is at a first logical value corresponding to the first logic state and responsive to the occurrence of a selected one of the pair of second transitions for resetting the flip-flop to a second logic state opposite to the first logic state when a logical reset signal supplied thereto is at the first logical value; and latch means for providing the reset signal at a logical value which corresponds to the logic state of the flip-flop substantially while the second clocking signal is at the particular second level that occurs just after the selected second transition and which corresponds to the logic state of the flip-flop that existed just before the second clocking signal made the second transition opposite to the selected second transition substantially while the second clocking signal is at the second level opposite to the particular second level.

2. A memory circuit as in claim 1 wherein the selected first transition is the beginning of a write period that extends to the next first transition opposite to the selected first transition and wherein the opposite second transition is substantially the beginning of a read period that extends substantially to the next selected second transition, characterized in that, in the situation where a first one of the read periods occurs and then a second one of the read periods occurs separated from the first read period by only a first one of the write periods that is completed before the second read period where the set signal is at the first logical value when the first write period begins, the flip-flop is set at the first logic state which is saved for the second read period provided that the first read period is completed before the first write period.

3. A memory circuit as in claim 2 characterized in that the first logic state is saved for the second read period even though the set signal is at the first logical value during at least part of the first read period.

4. A memory circuit as in claim 1 characterized in that the control means comprises:

a set trigger for setting the flip-flop to the first logic state;

a reset trigger for resetting the flip-flop to the second logic state; and inhibiting means for inhibiting the set trigger selectively while the first clocking signal is at the particular first level that occurs just after each selected first transition in response to which the set trigger set the flip-flop to the first logic state and for inhibiting the reset trigger selectively while the second clocking signal is at the particular second level that occurs just after each selected second transition in response to which the reset trigger reset the flip-flop to the second logic state.

5. A memory circuit as in claim 4 characterized in that, after the set trigger sets the flip-flop to the first logic state, the inhibiting means inhibits the set trigger during the entire period that the first clocking signal is at the particular first level that follows the setting of the flip-flop.

6. A memory circuit as in claim 5 characterized in that the inhibiting means inhibits the reset trigger only while the first clocking signal is also at the particular first level provided further that the set signal was at the first logical value just prior to the selected first transition.

7. A memory circuit as in claim 4 wherein the flip-flop is controlled through a first node from which a first logical flip-flop signal indicative of the logic state of the flip-flop is taken and through a second node from which a second logical flip-flop signal complementary to the first flip-flop signal is taken, characterized in that the inhibiting means comprises:

a first field-effect transistor (FET) whose source is coupled to a substantially constant voltage supply, whose gate electrode is coupled to the first node, and whose drain is coupled to the set trigger; and a second FET whose source is coupled to the voltage supply, whose gate electrode is coupled to the drain of the first FET, and whose drain is coupled to the reset trigger.

8. A memory circuit as in claim 7 characterized in that the inhibiting means further includes a third FET whose source and drain are coupled between the voltage supply and the source of the second FET and whose gate electrode is responsive to the first clocking signal.

* * * * *

UNITED STATES PATENT AND TRADEMARK OFFICE
CERTIFICATE OF CORRECTION

PATENT NO. : 4,459,683

DATED : July 10, 1984

INVENTOR(S) : YALAMANCHILI, et al

It is certified that error appears in the above-identified patent and that said Letters Patent is hereby corrected as shown below:

Col. 3, line 5, after "to" insert -- as --;

line 42, "resetting" should read -- setting --;

line 43, after "FF" insert -- again --.

Col. 5, line 57, "Q" should read -- $\bar{Q}$ --.

Col. 6, line 45, "$\emptyset_2$", second instance, should read -- $\bar{\emptyset}_2$ --.

Col. 8, line 30, "'038" should read -- "0" --.

Col. 11, line 34, before "The" insert -- The read period ends when clock $\bar{\emptyset}_2$' goes low. --.

Signed and Sealed this

Thirteenth Day of November 1984

[SEAL]

Attest:

Attesting Officer

GERALD J. MOSSINGHOFF

Commissioner of Patents and Trademarks